(12) United States Patent
Frenkil et al.

(10) Patent No.: US 7,590,962 B2
(45) Date of Patent: Sep. 15, 2009

(54) DESIGN METHOD AND ARCHITECTURE FOR POWER GATE SWITCH PLACEMENT

(75) Inventors: Gerald L. Frenkil, Concord, MA (US); Srinivasan Venkatraman, Acton, MA (US)

(73) Assignee: Sequence Design, Inc., Sunnyvale, CA (US)

( * ) Notice: Subject to any disclaimer, the term of this patent is extended or adjusted under 35 U.S.C. 154(b) by 144 days.

(21) Appl. No.: 10/998,204

(22) Filed: Nov. 26, 2004

(65) Prior Publication Data

US 2006/0114025 A1 Jun. 1, 2006
US 2009/0174434 A9 Jul. 9, 2009

Related U.S. Application Data

(63) Continuation-in-part of application No. 10/739,659, filed on Dec. 17, 2003, now Pat. No. 7,117,457.

(51) Int. Cl.
*G06F 17/50* (2006.01)
(52) U.S. Cl. .................. 716/11; 716/8; 716/9; 716/10; 326/33; 326/81
(58) Field of Classification Search ............... 716/8–11; 326/33, 81
See application file for complete search history.

(56) References Cited

U.S. PATENT DOCUMENTS

| | | | |
|---|---|---|---|
| 7,055,007 B2* | 5/2006 | Flautner et al. | 711/156 |
| 7,117,457 B2* | 10/2006 | Frenkil | 716/2 |
| 2003/0218478 A1* | 11/2003 | Sani et al. | 326/33 |
| 2005/0276132 A1* | 12/2005 | Severson et al. | 365/202 |

* cited by examiner

*Primary Examiner*—Naum B Levin
(74) *Attorney, Agent, or Firm*—Haynes and Boone, LLP

(57) ABSTRACT

A design method places power gates or switch cells using unoccupied locations of logic cell rows. Two types of such switch cells, filler switches and sealer switches, may be provided using the unoccupied locations. In one embodiment, virtual ground voltage references to the logic cells are routed to their associated switch cells. Because conventional standard cell design and placement techniques achieve only a placement density or utilization between 70-80% (i.e., unoccupied space constitutes between 20 to 30% of the available space in each row of logic cells), by placing the power gate cells in the unoccupied space, the method does not increase the silicon real estate requirement even though the power gate cells are introduced into the design. Optimization techniques may be applied to achieve proper sizing and distribution of power gate cells, so as to avoid a performance penalty due to the power gate cells. In one embodiment, fine-grained power gating is achieved by selectively providing non-power-gated logic cells among power-gated logic cells.

34 Claims, 5 Drawing Sheets

DESIGN METHOD AND ARCHITECTURE FOR POWER GATE SWITCH PLACEMENT

CROSS-REFERENCE TO RELATED APPLICATIONS

The present application is a continuation-in-part application of U.S. patent application, Ser. No. 10/739,659, entitled "Current Scheduling System and Method for Optimizing Multi-threshold CMOS Designs," filed on Dec. 17, 2003, and issued as U.S. Pat. No. 7,117,457 on Oct. 3, 2006.

BACKGROUND OF THE INVENTION

1. Field of the Invention

The present invention relates to a method for designing multi-threshold complementary metal-oxide-semiconductor (MTCMOS) circuits and the physical architecture of the circuits resulting from using such a method. In particular, the present invention relates to a design method for placing power switches in an MTCMOS circuit, and the physical circuit architecture of MTCMOS circuits resulting from using this method.

2. Discussion of the Related Art

A significant concern in integrated circuit design is reducing leakage currents. Leakage currents flow in logic circuits from a power supply node into the ground node because the switching characteristics of the transistors in the logic circuits are not ideal (i.e., the transistors cannot be completely shut off).

In MTCMOS circuits, one technique that reduces leakage current is to a place a "power gate" (also known as "power switch" or simply, "switch cell") between the lowest potential terminal of a logic gate (the "virtual ground" reference) and the ground reference. This technique is illustrated schematically in FIG. 1, which shows power gate or switch cell 101 controlling the leakage current path of logic cell 102 to ground. As shown in FIG. 1, logic cell 102 is formed using lower threshold voltage transistors to provide short switching times. The power gate is typically a transistor which has a higher threshold voltage than the threshold voltage of the transistors used to implement the logic cells. The power gate interrupts the leakage current path to ground. When power gate 101 is conducting (i.e., a high voltage is provided at control node 106), a leakage current flows from power supply node 104 through logic cell 102 to virtual ground node 103, and through power gate 101 to true ground node 105. However, during standby (i.e., when a voltage much less than power gate 101's threshold voltage is imposed at control node 106), power gate 101 cuts off the leakage current path from virtual ground node 103 to true ground node 105.

Several design methods have been used to provide power gate cells. One method ("integrated switches"), as illustrated by way of example in FIG. 2, integrates power gate 202 with logic cell 201. In this arrangement, logic cells, such as logic cell 201, are placed in rows according to a conventional standard cell design method. As shown in FIG. 2, conductors 204a and 204b are part of a power supply grid providing a power supply voltage to the logic cells. Similarly, conductors 203a and 203b are part of a ground reference grid providing a true ground reference to the logic cells. Virtual ground nodes are located within each logic cell (e.g., logic cell 201).

FIG. 3 illustrates a second method ("cavity switches") for placing power gates, in which a row of logic cells (e.g., logic cells 301a, 301b, 301c and 301d) share power switches provided in an adjacent dedicated row ("switch cavity area"; e.g., power switch cavity area 302). Conductors 303a and 303b provide the true ground voltage reference, and conductors 304a and 304b provide the power supply voltage reference.

FIG. 4 illustrates a third method ("ring switches") for placing power gates, in which a group of logic cells (e.g., logic cell 401) share power switches placed in an annular strip (e.g., power gate area 402) encircling the logic cells. Power switches within power gate area 402 are typically connected in parallel. Conductors outside power gate area 402 route the true ground to the power gates in power gate area 402, Virtual ground reference nodes are provided in the area between power gate area 402 and logic cells 401.

FIG. 5 illustrates a fourth method ("grid switches") for placing power gates, in which power switches (e.g., power switches in power switch areas 502a and 502b) are placed in predetermined locations at regular intervals to service rows of logic cells in their proximity (e.g., logic cells 501a and 501b are serviced by power switches in power switch 502a). The power switches in the predetermined power switch areas may be connected in parallel, and conductors (e.g., conductors 505a, 505b and 505c) running orthogonal to the rows of logic cells may provide a virtual ground reference grid.

SUMMARY OF THE INVENTION

A design method places power gates or switch cells at unoccupied locations of logic cell rows. These power gates need not be globally connected in parallel. In one embodiment ("filler switches"), no restrictions are imposed on the placement of the power gates. In another embodiment ("sealer switches"), the power gates are placed adjacent a group of contiguously placed logic cells of the same sleep signal domain. Because conventional standard cell design and placement techniques achieve only a placement density or utilization typically between 70-80% (i.e., unoccupied space constitutes between 20 to 30% of the available space in each row of logic cells), by placing the power gate cells in the unoccupied space, the overall real estate requirement for the integrated circuit is not increased even though the power gate cells are introduced into the design. Placement optimization techniques may be applied to achieve proper sizing and distribution of power gate cells, so as to avoid a performance penalty due to the power gate cells. In one embodiment, fine-grained power gating is achieved by selectively providing non-power-gated logic cells with the power-gated logic cells.

The present invention is applicable to both placing power gate cells that connect a virtual ground voltage reference to true ground and placing gate cells that connect a virtual power supply voltage reference to a true power supply voltage reference.

Using filler switches, the virtual ground voltage references to the logic cells may be routed using conventional logic signal routing techniques. These virtual ground references may be routed using routing channels, using a channel-less routing technique (e.g., over logic cells in one or more signal routing layers), or using a shared virtual ground bus. The method of the present invention may be used with any signal routing techniques.

According to one embodiment of the present invention, an integrated circuit may include a power supply voltage reference, a ground voltage reference, logic cells placed in a linear configuration to form rows of cells, and power gate cells provided within the rows of cells. In one embodiment, conductors in routing channels are used to route the virtual ground signals between the logic cells and the power gates, in the same manner as logic signals are routed among the logic cells under a conventional standard cell design method.

In one embodiment, power gate cells each having a different number of transistors connected in a parallel configuration may be provided in a design library. A properly selected power gate cell limits both the circuit real estate required and the amount of voltage drop across the power gate cells.

In one embodiment, power-gated logic cells are placed along with non-power-gated logic cells (i.e., logic cells that are directly connected to the true ground voltage reference). The non-power-gated logic cells may be used to achieve higher circuit performance where needed. In this manner, high circuit performance is achieved while trading-off a very small amount of additional leakage current.

In one embodiment, the unoccupied spaces into which power gate cells are placed occur at a more or less random fashion, so that the power gate cells are placed in a more or less irregular distribution. Optimization techniques may be applied to reduce the irregularity of the distribution of the power gate cells. Such optimization techniques may include adjusting the number of power gate cells to use, the size of each power gate cell and the selected locations of the power gate cells.

According to one embodiment of the present invention, a method for placing power gate cells include first placing logic cells in rows. Among these placed logic cells are logic cells to be power gated each having a terminal for coupling a virtual ground voltage reference. Then, power gate cells are placed into unoccupied spaces in the rows and virtual ground voltage nodes are routed between the logic cells and the power gate cells according to the routing technique adopted. The widths of the conductors for carrying the virtual ground voltage reference are provided according to an estimate of wire resistance.

In one embodiment, the size of each power gate cell placed in the unoccupied spaces is computed according to the estimated currents in the logic cells to which the power gate cell is to be connected. The currents may be estimated using a static or a dynamic technique. In another embodiment, the size of each power gate cell placed may be determined using the number of transistors in the logic cells to which that power gate cell is connected.

In one embodiment, prior to placing the power gate cells, a placement optimization step is performed to resize the unoccupied spaces, such as by moving the logic cells within each row along a lateral direction, or by moving logic cells across rows in the vertical direction.

In one embodiment, prior to placing the power gate cells, a placement optimization step is performed to rearrange the logic cells to achieve a specified distribution of the unoccupied space. The specified distribution may be achieved by targeting a specified distance along each row between two power gate cells.

The present invention is better understood upon consideration of the detailed description below and the accompanying drawings.

DETAILED DESCRIPTION OF THE PREFERRED EMBODIMENTS

The present invention provides a design method in which power gates or switch cells are placed at unoccupied locations of logic cell rows. The inventors observe that, using conventional standard cell design and placement techniques, the placement density or utilization that can be achieved is typically between 70-80% (i.e., unoccupied space constitutes between 20 to 30% of the available space in each row of logic cells). The present invention places power gate cells in the unoccupied space. The available unoccupied space typically provides sufficient space to accommodate all the power gate cells required in a row of logic cells. Thus, inclusion of power gates in the logic circuit design does not increase the silicon real estate requirement.

In this detailed description, the present invention is illustrated by embodiments in which the power gate cells connect the logic cells to a true ground voltage reference. However, the present invention is equally applicable to power gate cells which connect the logic cells to a true power supply voltage reference. (In that case, the terminals connecting the power gates to the logic cells are referred to as "virtual power voltage references"). The present invention is also applicable to a design in which power gate cells that connect logic cells to a true ground voltage reference and power gate cells that connect logic cells to a true power supply voltage references are both used.

Figure 1:
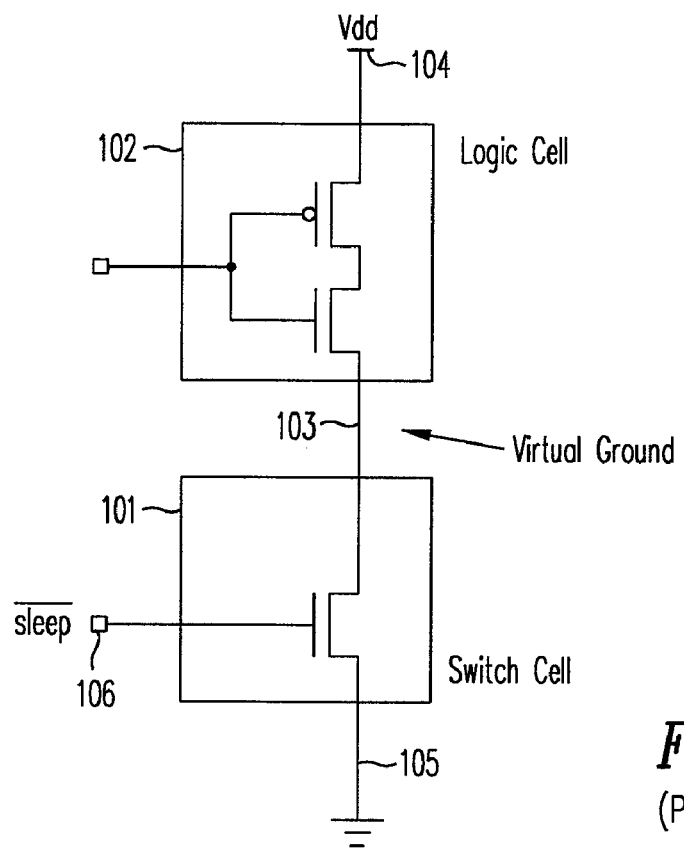
FIG. 1 shows schematically power gate or switch cell 101 controlling the leakage current path of logic cell 102 to ground.
Figure 2:
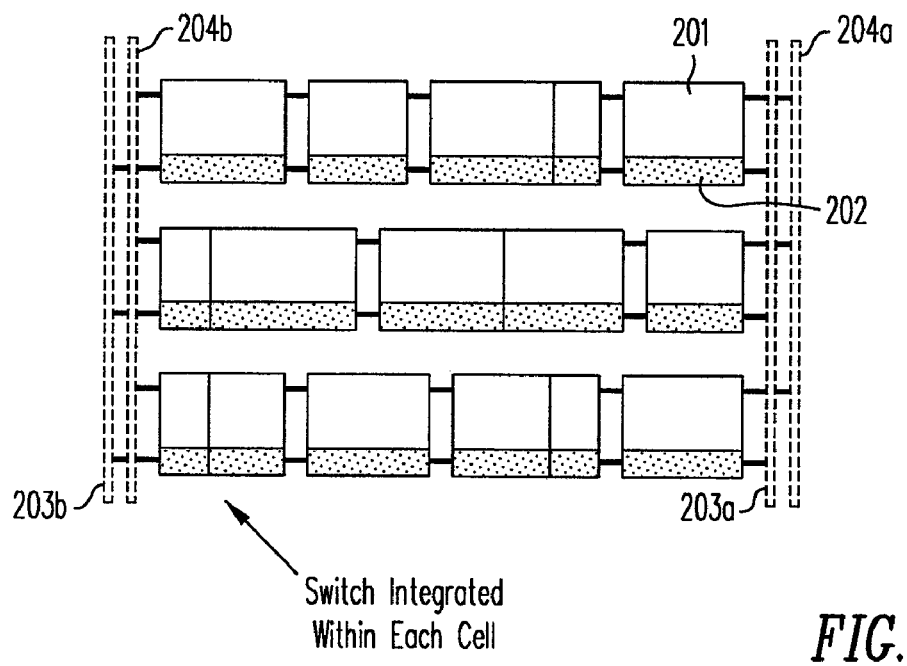
FIG. 2 illustrates logic cell 201 integrating power gate 202; logic cell 201 may be placed using a conventional standard cell design method.
Figure 3:
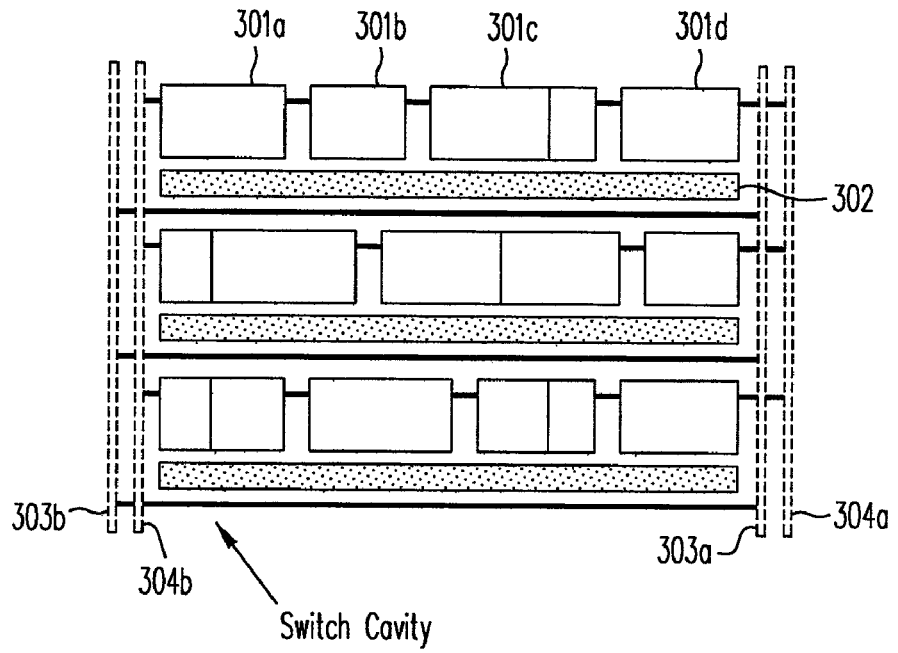
FIG. 3 illustrates a second method for placing power gates, in which a row of logic cells (e.g., logic cells 301a, 301b, 301c and 301d) share power switches provided in an adjacent dedicated row ("switch cavity area"; e.g., power switch row 302).
Figure 4:
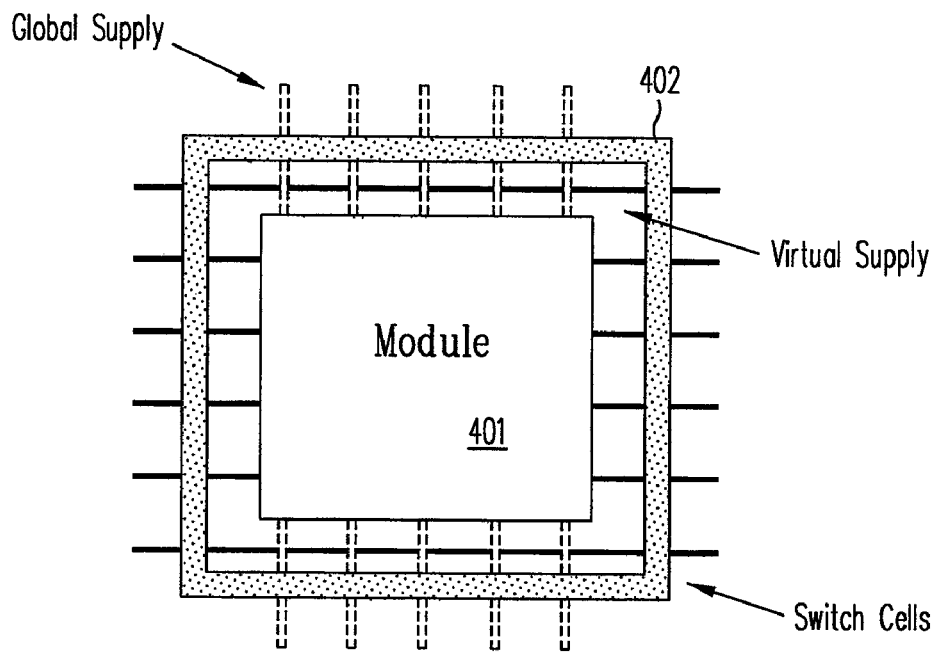
FIG. 4 illustrates a third method for placing power gates, in which a group of logic cells (e.g., logic cell 401) share power switches placed in an annular strip (e.g., power gate area 402) encircling the logic cells.
Figure 5:
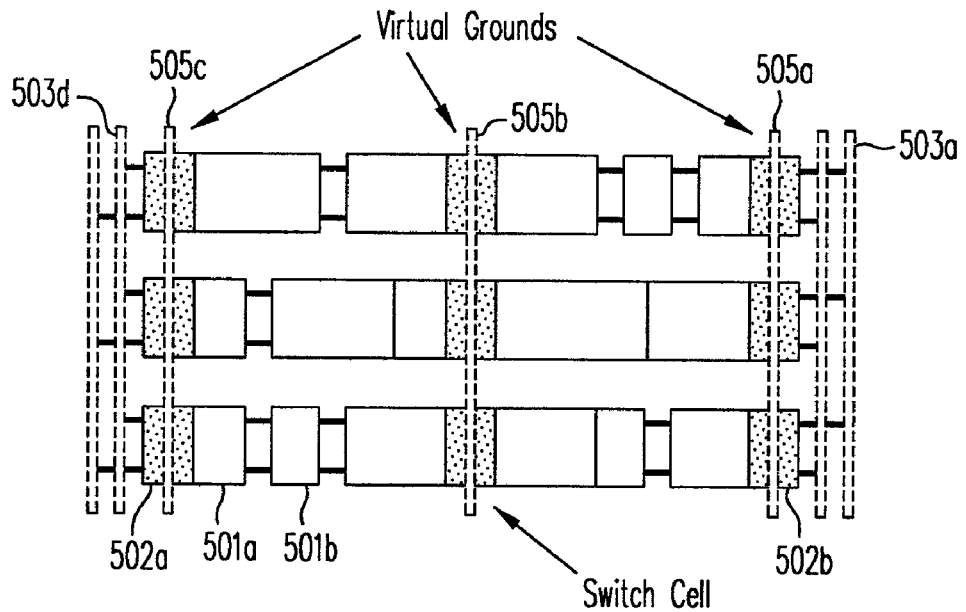
FIG. 5 illustrates a fourth method ("grid switches") for placing power gates, in which power switches (e.g., power switches in power switch areas 502a and 502b) are placed in predetermined locations at regular intervals relative to rows of logic cells.
Figure 6A:
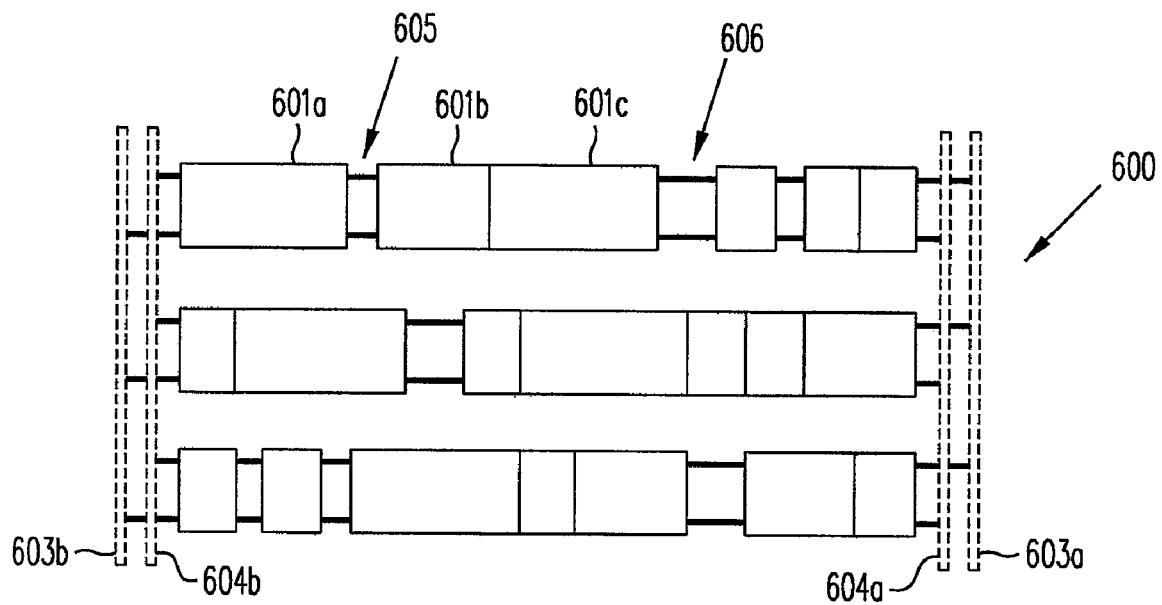
FIGS. 6a and 6b illustrate a design method ("filler switches"), in accordance with one embodiment of the present invention.
Figure 6B:
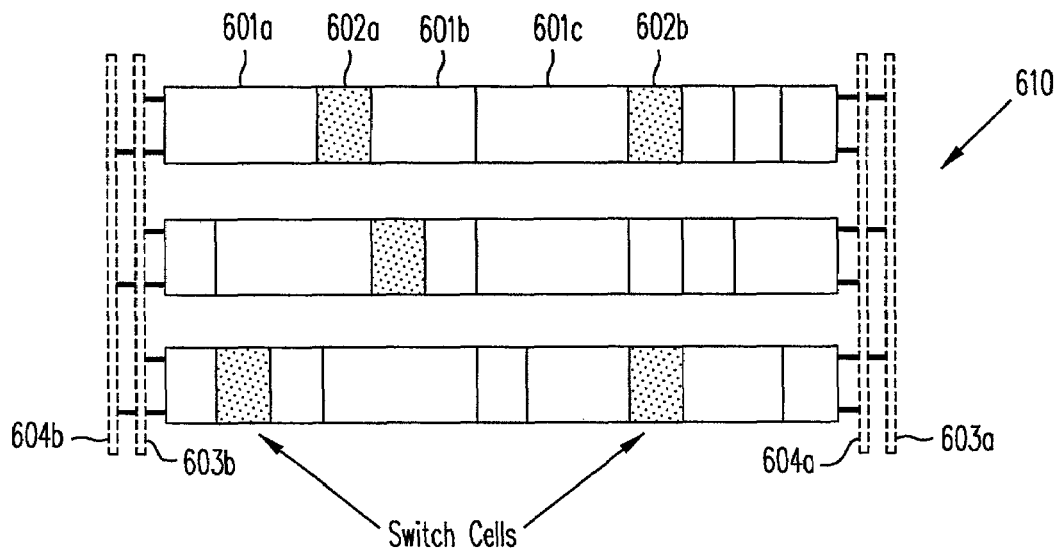

FIGS. 6a and 6b illustrate a design method ("filler switches"), in accordance with one embodiment of the present invention. Under the filler switches design method, the filler switch cells (i.e., the power gate cells) are designed to have a same height and contour as logic cells in the design library, so that the filler switch cells may be placed in a conventional logic cell row in the same manner as the manner logic cells are placed in such a row. As shown in FIG. 6a, configuration 600 represents a placement of logic cells (e.g., logic cells 601a, 601b and 601c) designed for conventional standard cell design techniques. FIG. 6a shows, for example only, three rows of logic cells separated by spaces ("channels") which are areas reserved for routing signals among the logic cells.

Configuration 600 may be achieved using a conventional placement technique, but without placing any filler switches. In one embodiment, the placements of logic cells and filler switches take place using separate tools. In that embodiment, the placement of logic cells carried out by a placement tool that has no knowledge of the subsequent step that provides the filler switches. In another embodiment, the placement of the logic cells and the filler switches may be carried out using the same tool, with the placement of the logic cells carried out in a first phase during which filler switches are excluded. Excluding filler switches may be achieved either by providing an appropriate weight to the filler switches in the placement cost function, or by excluding the filler switches from the design library used in this particular placement step. In the initial placement, the logic cells may be placed according to their "sleep signal domain" (i.e., logic cells which are to be connected to filler switch cells controlled by the same control signal). A logic cell's sleep signal domain may be identified by traversing the netlist, beginning from the switch cell's control signal backwards through buffers and serially connected inverter pairs to the source of the control signal.

As shown in FIG. 6a, conductors 603a and 603b provide the power supply voltage reference in a conventional manner. Similarly, conductors 604a and 604b provide in a conventional manner the true ground voltage references for the rows of logic cells shown. Typically, as shown in FIG. 6a, the placement algorithm is able only to fill 70-80% of the available space in each row of logic cells, leaving gaps such as gaps 605 and 606. In the rare case where the placement algorithm is able to achieve a higher utilization rate, thus leaving insufficient unoccupied space for placing the filler switches, the placement algorithm may be directed not to target the available space to a lower degree of utilization, so as to allow a minimum amount of unoccupied space for the filler switch cells.

The virtual ground voltage references between the power gates and the logic cells they serve may be routed using any signal or power routing technique. Such techniques include conventional channel or channel-less routing techniques, or the use of a shared virtual ground or power bus. In one embodiment, the virtual ground voltage references may be routed in the same manner as a logic signal between logic cells.

Figure 6C:
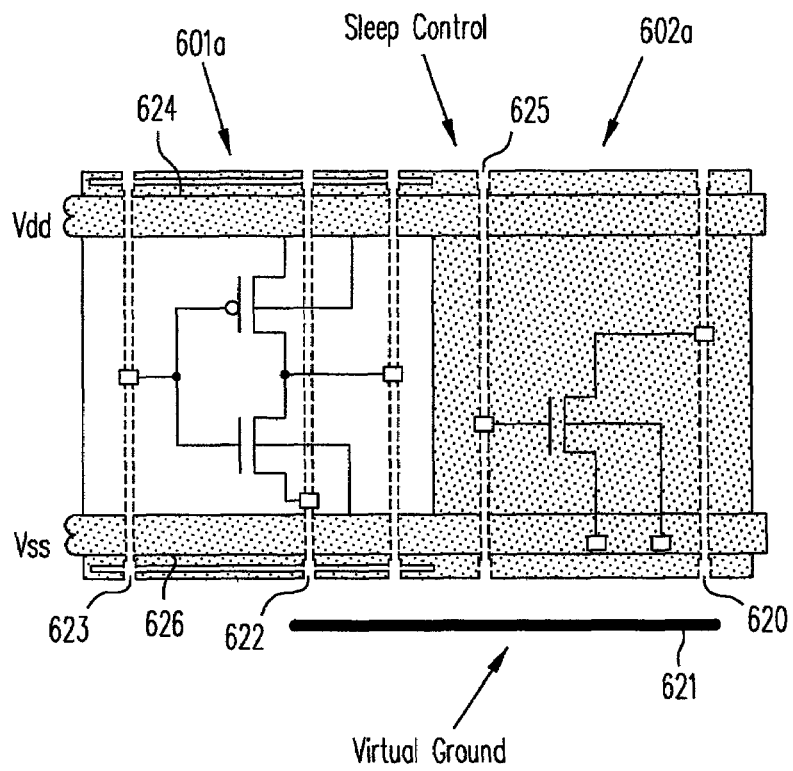
FIG. 6c illustrates, for example, the structures of logic cell 601a and filler switch cell 602a, according to one embodiment of the present invention.

FIG. 6c illustrates, for example, the structures of logic cell 601a and filler switch cell 602a, according to one embodiment of the present invention. As shown in FIG. 6a, logic cell 601a and filler switch cell both all the true ground and the true power voltage references to run through their respective top and bottom portions (i.e., portions 624 and 626). Conductor 623 is provided in logic cell 601a for connecting a logic input signal. Similarly, conductor 625 in filler switch cell 602a is provided for to connect the sleep control signal of the power gate. Conductor 622 and conductor 620 are provided in logic cell 601a and filler switch cell 602a, respectively, to connect the virtual ground voltage reference. The connection may be effectuated, for example, by conductor 624 using a suitable routing technique.

According to one embodiment of the present invention, the design library includes a number of filler switch cells of different sizes and different orientations. In the next step, the unoccupied spaces ("gaps") in the logic cell rows are identified. For each gap, one or more filler switch cells are placed. The sizes of the filler switch cells placed may be determined, for example, from an estimate of the currents in the logic cells assigned to the filler switches. The current in the logic cells assigned to a filler switch may be estimated using a static or dynamic current estimate technique. Examples of suitable current estimate techniques include current averaging, or any of the dynamic current estimation techniques disclosed in U.S. patent application Ser. No. 10/739,659, entitled "Current Scheduling System and Method For Optimizing Multi-Threshold CMOS Designs," filed on Dec. 17, 2003 and U.S. Pat. No. 6,807,660, "Vectorless Instantaneous Current Estimation", filed on Oct. 1, 2002 and issued on Oct. 19, 2004.

The sizes of the filler switch cells placed may also be determined by the number of logic cell transistors in the vicinity to which the filler switch cells may be assigned. Using any of these and other suitable methods, the required necessary cumulative device size for the power gates for each group of logic cells is then determined. Based on this required size, appropriate filler switch cells are selected and placed in the gaps. The orientations[1] of the filler switch cells placed are selected to minimize virtual ground net resistance. FIG. 6b shows the resulting configuration 610. For example, gaps 605 and 606 of FIG. 6a are replaced by filler switch cells 602a and 602b, respectively.

[1]Multiple versions of a filler switch cell of a given current capability may be provided (e.g., a filler switch cell and its mirror image). In some instances, the selection of one version over another version may result in a lower resistance in the virtual ground signal. The difference may be caused, for example, by the position of the conductor for connecting the virtual ground voltage reference.

An accurate global route model for estimating the wire resistance of a virtual ground net based on the location of the filler switch cell and the location of the logic cells it serves is a preferred tool for guiding placement. In one embodiment, during optimization, the filler switches are assigned to logic cells in descending order of current requirements (i.e., the logic cells with the highest current requirements are assigned filler switches first), so that the logic cells with the highest current requirements have filler switches placed closest to them. Filler switches serving the same logic cell or group of logic cells are connected in parallel in provide a single virtual ground net, so as to meet the virtual ground threshold for logic cells with higher current requirements and to maximize utilization of the available space for filler switch cell placements (i.e., filler switches serving the same logic cell or group of logic cells may be distributed over several small gaps in the same vicinity). Also, filler switch cell placements may be constrained by a wire limit specification so as to limit the voltage drop between the virtual ground voltage reference at the logic cells and the true ground reference. The wire limit specification can also minimize the expected electromigration effects on the resulting virtual ground net.

The present invention may be used with a "local power gating" technique. In such a technique, filler switch cells, even though they share the same sleep signal domain or the same true ground connection, are not connected in parallel.

A placement optimization technique which includes, for example, readjusting the size of the gaps by moving logic cells in the lateral directions, may be used to allow the required filler switches to fit into the gaps. Where appropriate, logic cells may also be moved or exchanged between rows to provide or to optimize the gaps used for filler cells. The gaps may also be resized and relocated so that the filler switch cells replacing the gaps may be limited to a specified size and distributed in a target distribution fashion. An optimization step that allows rearranging logic cell placements within a row, or moving logic cells between rows, may be used to allow a proper distribution of the filler switch cells. Such redistribution of filler cells may optimize performance, for example, by avoiding assigning a filler switch cell to service a greater number of logic cell transistors than the filler switch cell is designed for, thus impacting timing. In general, it is desirable to have filler switch cells placed as closely as possible to the logic cells they serve. A suitable cost function for assigning logic cells to filler cells may take into consideration user designated distance limits, wire resistance, estimated currents, expected voltage drop between the virtual ground voltage reference and the true ground reference, and signal integrity concerns. It is also desirable to restrict movement of the logic cells during placement of the filler switch cells. In this embodiment, because the placements of the filler switch cells depend on the initial placements of the logic cells, the filler switch cells are therefore placed relatively randomly and in an irregular fashion. Alternatively, the placements of the logic cells may be adjusted after determination of sizing of the filler switch cells, so that the filler switch cells may be placed in a more regular fashion. After a filler switch cell is placed, its movement should be restricted.

The placement may be further optimized, where possible, by resizing the placed filler switch cells to compensate for any variance between the estimated interconnect resistance and the actual interconnect resistance achieved due to the movement of the filler switch cells and the logic cells. After the resizing, the placement optimization algorithm can be re-run to further improve the placement. This process of resizing and placement optimization can be iterated until the incremental improvement falls below a given value of a designated figure of merit.

A suitable signal routing technique may then be used to route in the channels the virtual ground voltage references, the logic signals among the logic cells, and the control signals for the filler switches. Thus, according to this embodiment of the present invention, no dedicated routing channels for the virtual ground voltage reference are required. The width of the conductor used to route the virtual ground voltage references may be adjusted according to estimated currents and wire resistances, so as to minimize the impact on the switching speed during active logic circuit operations. To minimize voltage drop in the virtual ground nets, wide wires may be used for the virtual ground nets. As mentioned above, the present invention does not dictate the use of any routing technique. Thus, the present invention can be applied to a design using a channel-less routing technique (e.g., routing over cells). In another embodiment, shared virtual ground buses may be provided.

Figure 7:
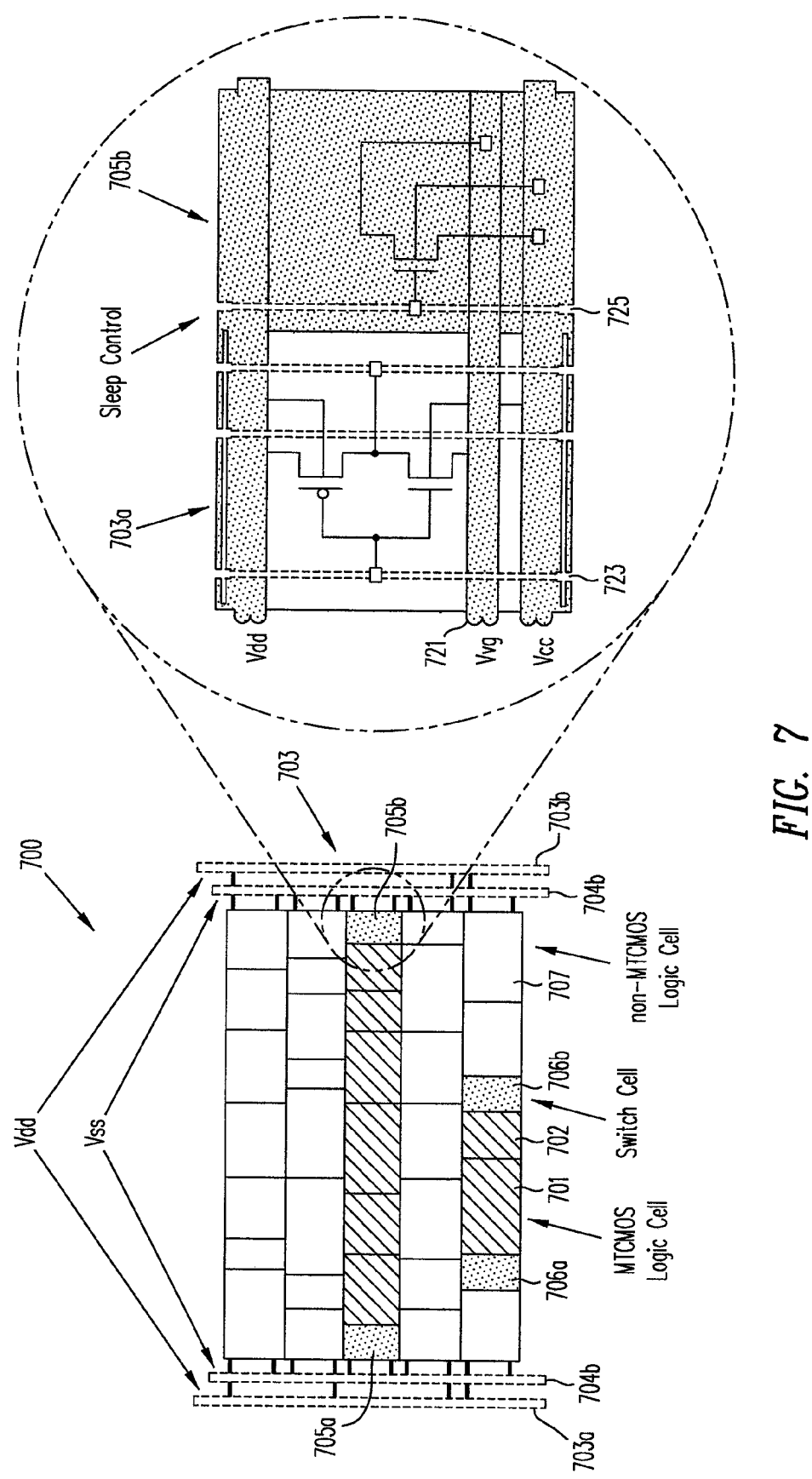
FIG. 7 illustrates using sealer switch cells in accordance with one embodiment of the present invention.

While placements of the filler switch cells are unconstrained, the present invention also provides a method that imposes a requirement on where the power gate cell may be placed. This method ("sealer switches") requires that the power gate cells ("sealer switches") to be placed at one or both ends of a group of contiguously placed power-gated logic cells of the same sleep domain. FIG. 7 illustrates using sealer switch cells in accordance with one embodiment of the present invention. As shown in FIG. 7, configuration 700 includes both power-gated logic cells (e.g., logic cells 701 and 702) and logic cells that are not power-gated (e.g., logic cell 707). In contrast to the filler switches method, the sealer switch cells are placed at one end or both ends of contiguously placed logic cells of the same sleep domain. In this example, sealer switch cells 706a and 706b are provided next to logic cells 701 and 702. If an entire row of logic cells (e.g., logic cell row 703) are in the same sleep signal domain, sealer switch cell may be placed at one or both ends of the row (e.g., sealer switch cells 705a and 705b are provided at the ends of logic cell row 703).

FIG. 7 also shows the internal structures of logic cell 703-n of row 703 and sealer switch cell 705b. As shown in FIG. 7, conductors (e.g., conductor 723 and 725) are provided for connecting logic signals and a sleep control signal to logic cell 703-n and sealer switch cell 705b, respectively. Unlike a filler switch cell, virtual ground voltage reference 721 is provided in the same manner as the true ground and the true power voltage references. In this manner connection between a logic cell and its associated sealer switch cell is effectuated upon placement, thereby obviating a subsequent routing step. The optimization techniques discussed above with respect to filler switches may be used to rearrange logic cells and the gaps to make room for the sealer switch cells.

Except for the placement constraint on the sealer switches relative to their associated logic cells, sealer switches achieve substantially the same flexibility and benefits as the filler switches discussed above.

The methods for placing filler switches and sealer switches, and their optimization techniques according to the present invention may be carried out before signal routing, after signal routing or both.

The following table compares the characteristics of the various design techniques for MTCMOS discussed in this specification:

| Characteristic | Switches Cavity | Integrated switches | Ring Switches | Grid Switches | Filler Switches | Sealer Switches |
|---|---|---|---|---|---|---|
| Fixed placement locations | Yes | Yes | Yes | Yes | No | No, but must abut associated logic cells |
| Dedicated Virtual ground Rail | Yes | Yes | Yes | Yes | No | Yes |
| Easy switch sizing | Yes | Yes | No | No | Yes | Yes |
| Effect of switch sizing on power routing | Low | Low | Low | High | None | None |
| Suitable for Coarse-Grained Power Gating | Yes | Yes | Yes | Yes | Yes | Yes |
| Suitable for Fine-Grained Power Gating | Yes | Yes | No | No | Yes | Yes |
| Block Area Bloat | High | High | High | High | Low | Low |
| Compatibility with Existing placement flows | High | Low | Low | Low | High | Low |
| Compatibility with existing routing flows | High | Low | Low | Low | High | High |
| Ability to place power gated logic & non-powergated logic together | Yes | Yes | No | No | Yes | Yes |
| Design/Analyze/Optimize turnaround time | Fast | Fast | Slow | Slow | Fast | Fast |

Based on the characteristics evaluated in the chart above, the inventors conclude that the filler switch method has the following advantages over the prior art:

| Filler Switch and Sealer Switch Advantage | Resulting Benefit |
|---|---|
| Non-fixed placement locations generally, except sealer switches must abut associated logic cells | Placement flexibility |
| No dedicated virtual ground rail | Placement and routing flexibility |
| Easy switch sizing calculation | More effective optimizations |
| Switch sizing does not effect power routing | Faster, simpler physical design |

-continued

| Filler Switch and Sealer Switch Advantage | Resulting Benefit |
|---|---|
| Ability to place power gated logic & nonpower-gated logic together | Easy physical design for fine-grained power gating |
| Low area bloat (low total area overhead) | Smaller area, resulting in lower cost design |
| Compatibility with existing placement flows | Easy adoption of power gating method |
| Compatibility with existing routing flows | Easy adoption of power gating method |
| Fast Design/Analyze/Optimize turnaround time | Less time needed to tape-out chip |

The detailed description above is provided to illustrate the specific embodiments of the present invention and is not intended to be limited. Numerous modifications and variations within the scope of the present invention are possible. The present invention is set forth in the following claims.

We claim:

1. A method for placing power gate cells in a physical circuit design of an integrated circuit, comprising:
in the physical design of the integrated circuit stored in a computer system:
providing a conductor for carrying a voltage reference;
placing a plurality of logic cells in one or more rows, wherein the logic cells include a first collection of the logic cells each having a terminal for coupling a virtual voltage reference; and
placing a plurality of power gate cells into unoccupied spaces remaining after placing the logic cells in the one or more rows, each power gate cell having a terminal for coupling the virtual voltage reference and a terminal for coupling to the conductor for carrying the voltage reference.

2. A method as in claim 1, wherein the first collection of logic cells are placed contiguously and wherein one of the power gate cells is placed abutting one of the logic cells in the first collection of logic cells.

3. A method as in claim 1, wherein conductors at a predetermined position are provided in abutting logic cell and the power gate cell, such that the terminal for coupling the virtual voltage reference in the logic cell is connected to the terminals for coupling the virtual voltage reference of the power gate cell by virtue of the placement.

4. A method as in claim 1, wherein the voltage reference is a ground voltage reference.

5. A method as in claim 1, wherein the voltage reference is a power supply voltage reference.

6. A method as in claim 1, wherein the plurality of the power gate cells are placed in unoccupied spaces between the logic cells that result from placing of the logic cells, the logic cells being placed using an algorithm that provides an initial placement of the logic cells without taking into account subsequent placements of the power gate cells.

7. A method as in claim 1, wherein a size of each power gate cell placed in the unoccupied spaces is computed according to an estimate of currents in the logic cells to be connected to the power gate cell.

8. A method as in claim 7, wherein the estimate of the currents is carried out using a static estimation technique.

9. A method as in claim 7, wherein the estimate of the currents is carried out using a dynamic estimation technique.

10. A method as in claim 1, wherein a size of each power gate cell placed in the unoccupied spaces is computed using a number of transistors in the logic cells to which that power gate cell is connected.

11. A method as in claim 1, further comprising routing the virtual voltage reference to connect the terminals for coupling the virtual voltage reference of the first collection of the logic cells to the terminals for coupling the virtual voltage reference of the power gate cells.

12. A method as in claim 11, wherein the routing is carried out using conductors in routing channels.

13. A method as in claim 11, wherein the routing is carried out using a channel-less routing technique.

14. A method as in claim 11, wherein the routing is carried out using a shared virtual voltage reference bus.

15. A method as in claim 1, further comprising resizing the unoccupied spaces by moving the logic cells within each row along a lateral direction.

16. A method as in claim 1, further comprising resizing the unoccupied spaces by moving the logic cells across rows.

17. A method as in claim 1, wherein, prior to placing the power gate cells, a placement optimization step is performed to rearrange the logic cells to achieve a specified distribution of the unoccupied space.

18. A method as in claim 17, wherein the specified distribution is achieved by targeting a specified distance along each row between two power gate cells.

19. A method as in claim 1, further comprising connecting a second collection of logic cells directly to the conductor for providing the voltage reference.

20. A method as in claim 1, wherein widths of conductors used for connecting between the logic cells and the power gate cells are provided according to an estimate of wire resistance.

21. A method as in claim 1, wherein the logic cells having a common sleep domain are placed in close proximity of each other.

22. A method as in claim 21, further comprising traversing a netlist to identify a control signal of the power gate associated with each logic cell.

23. A method as in claim 22, wherein the traversing comprises backward tracing the control signal through buffers and inverter pairs.

24. A method as in claim 1, wherein the logic cells and the power gate cells are placed according to a constraint relating to a user designated distance.

25. A method as in claim 1, wherein the logic cells and the power gate cells are placed according to a constraint relating to an estimated voltage drop.

26. A method as in claim 1, wherein the logic cells and the power gate cells are placed according to a constraint relating to signal integrity concerns.

27. A method as in claim 1, wherein each power gate cell is placed according to a global route model which estimates a wire resistance based on the placement of the power gate cell and the placements of the logic cell associated with the power gate.

28. A method as in claim 1, wherein each power gate cell is placed according to a global route model which estimates a current based on the placement of the power gate cell and the placements of the logic cell associated with the power gate.

29. A method as in claim 1, wherein the power gate cells are assigned to logic cells according to a descending order of the current requirements.

30. A method as in claim 1, wherein the power gate cell is placed subject to a current limit constraint.

31. A method as in claim 1, wherein the logic cells using a first placement step and the power gate cells are placed using a second placement steps, wherein the first placement step is performed without regard to the placement of the power gate cells.

32. A method as in claim 1, wherein the logic cells and the power gate cells are placed using multiple placement steps, wherein one of the placement steps is carried out with the power gate cells excluded.

33. A method as in claim 32, further comprising assigning the power gate cells a high cost function, so as to exclude the power gate cells in that placement step.

34. A method as in claim 32, wherein the power gate cells are excluded from a library used in that placement step.

\* \* \* \* \*